(12) United States Patent
Chen et al.

(10) Patent No.: US 9,349,473 B1
(45) Date of Patent: May 24, 2016

(54) DATA SAMPLING CIRCUIT MODULE, DATA SAMPLING METHOD AND MEMORY STORAGE DEVICE

(71) Applicant: PHISON ELECTRONICS CORP., Miaoli (TW)

(72) Inventors: Sheng-Wen Chen, Taichung (TW); Wei-Yung Chen, Hsinchu County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 14/619,074

(22) Filed: Feb. 11, 2015

(30) Foreign Application Priority Data

Dec. 25, 2014 (TW) .............................. 103145466 A (51) Int. Cl.
*G11C 16/06* (2006.01)
*G11C 16/28* (2006.01)
*G11C 16/14* (2006.01)

(52) U.S. Cl.
CPC ................ *G11C 16/28* (2013.01); *G11C 16/14* (2013.01)

(58) Field of Classification Search
CPC ...... G11C 13/004; G11C 7/04; G11C 7/1066; G11C 7/1093; G11C 7/222; G11C 11/15; G11C 13/0069; G11C 13/0097; G11C 16/06; G11C 2213/77; G11C 27/026; G11C 5/14; G11C 7/062; G11C 7/067; G11C 7/10; G11C 7/12
USPC ............... 365/100, 185.18, 148, 158, 189.05, 365/189.07, 226
See application file for complete search history.

(56) References Cited

U.S. PATENT DOCUMENTS

| 5,034,633 | A | * | 7/1991 | Stekelenburg | ....... G11C 19/285 326/21 |
| 2011/0108704 | A1 | * | 5/2011 | Kim | ..................... H04N 5/3745 250/208.1 |

* cited by examiner

*Primary Examiner* — Thong Q Le
(74) *Attorney, Agent, or Firm* — Jianq Chyun IP Office (57) ABSTRACT

A data sampling circuit module, a data sampling method and a memory storage device are provided. The method includes: receiving a differential signal and generating a sensing voltage pair according to the differential signal, where the sensing voltage pair includes a first sensing voltage and a second sensing voltage, a voltage value of the first sensing voltage is related to a first differential signal of the differential signal, and a voltage value of the second sensing voltage is related to a second differential signal of the differential signal; and receiving the sensing voltage pair and outputting a sampling data stream according to a clock of the differential signal and a voltage relative relationship of the sensing voltage pair.

33 Claims, 7 Drawing Sheets

| Receiving a differential signal and generating an sensing voltage pair according to the differential signal, where the sensing voltage pair includes a first sensing voltage and a second sensing voltage, a first voltage value of the first sensing voltage is related to a first differential signal of the differential signal, and a second voltage value of the second sensing voltage is related to a second differential signal of the differential signal | S601 |

| Receiving the sensing voltage pair and outputting a sampling data stream according to a clock of the differential signal and a voltage relative relationship of the sensing voltage pair | S602 |

DATA SAMPLING CIRCUIT MODULE, DATA SAMPLING METHOD AND MEMORY STORAGE DEVICE

CROSS-REFERENCE TO RELATED APPLICATION

This application claims the priority benefit of Taiwan application serial no. 103145466, filed on Dec. 25, 2014. The entirety of the above-mentioned patent application is hereby incorporated by reference herein and made a part of this specification.

BACKGROUND

1. Technical Field

The disclosure relates to a data sampling circuit module, and more particularly, relates to a data sampling circuit module, a data sampling method and a memory storage device.

2. Description of Related Art

In general, for saving power consumption in signal transmission, some data are transmitted by ways of differential signal. After a set of differential signal is received by a receiver device, the differential signal are recovered to input data stream. The input data stream is composed of a series of pulses, and waveforms of the pulses are related to bit data intended to be transmitted. For example, one specific waveform indicates transmission of the bit data "1", and another waveform indicates transmission of the bit data "0".

Traditionally, in order to identify the waveform of each of the pulses in the input data stream, the receiver device performs a massive amount of sampling for said data stream by using a clock signal with extremely high clock frequency and rebuilds the waveforms of the pulses in the data stream by analyzing whether signal obtained by the sampling is in logically high of the data stream or in logically low of the data stream. However, such sampling means requires use of the clock signal with extremely high frequency, which consumes more power of the system and has poor efficiency in terms of usages.

Nothing herein should be construed as an admission of knowledge in the prior art of any portion of the present disclosure. Furthermore, citation or identification of any document in this application is not an admission that such document is available as prior art to the present disclosure, or that any reference forms a part of the common general knowledge in the art.

SUMMARY

The disclosure provides a data sampling circuit module, a data sampling method and a memory storage device, which are capable of improving an efficiency for processing a received differential signal.

An exemplary embodiment of the disclosure provides a data sampling circuit module, which includes a sensing circuit and a sampling circuit. The sensing circuit is configured to receive a differential signal and generate a sensing voltage pair according to the differential signal, where the sensing voltage pair includes a first sensing voltage and a second sensing voltage, a first voltage value of the first sensing voltage is related to a first differential signal of the differential signal, and a second voltage value of the second sensing voltage is related to a second differential signal of the differential signal. The sampling circuit is coupled to the sensing circuit, where the sampling circuit is configured to receive the sensing voltage pair and output a sampling data stream according to a clock of the differential signal and a voltage relative relationship of the sensing voltage pair.

Another exemplary embodiment of the disclosure provides a data sampling method, which includes: receiving a differential signal and generating a sensing voltage pair according to the differential signal, where the sensing voltage pair includes a first sensing voltage and a second sensing voltage, a first voltage value of the first sensing voltage is related to a first differential signal of the differential signal, and a second voltage value of the second sensing voltage is related to a second differential signal of the differential signal; and receiving the sensing voltage pair and outputting a sampling data stream according to a clock of the differential signal and a voltage relative relationship of the sensing voltage pair.

Another exemplary embodiment of the disclosure provides a memory storage device which includes a connection interface unit, a rewritable non-volatile memory module and a memory controlling circuit unit. The connection interface unit is configured to couple to a host system. The rewritable non-volatile memory module includes a plurality of physical erasing units. The memory controlling circuit unit is coupled to the connection interface unit and the rewritable non-volatile memory module. The connection interface unit includes a data sampling circuit module, and the data sampling circuit module includes a sensing circuit and a sampling circuit. The sensing circuit is configured to receive a differential signal and generate a sensing voltage pair according to the differential signal, where the sensing voltage pair includes a first sensing voltage and a second sensing voltage, a first voltage value of the first sensing voltage is related to a first differential signal of the differential signal, and a second voltage value of the second sensing voltage is related to a second differential signal of the differential signal. The sampling circuit is coupled to the sensing circuit, where the sampling circuit is configured to receive the sensing voltage pair and output a sampling data stream according to a clock of the differential signal and a voltage relative relationship of the sensing voltage pair.

Based on the above, after receiving the differential signal, the disclosure is capable of generating the related sensing voltage pair according to the differential signal and outputting the sampling data stream according to the clock of the differential signal and the voltage relative relationship of the sensing voltage pair. As a result, the efficiency for processing the received differential signal may be improved.

To make the above features and advantages of the disclosure more comprehensible, several embodiments accompanied with drawings are described in detail as follows.

It should be understood, however, that this Summary may not contain all of the aspects and embodiments of the present disclosure, is not meant to be limiting or restrictive in any manner, and that the disclosure as disclosed herein is and will be understood by those of ordinary skill in the art to encompass obvious improvements and modifications thereto.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Reference will now be made in detail to the present preferred embodiments of the disclosure, examples of which are illustrated in the accompanying drawings. Wherever possible, the same reference numbers are used in the drawings and the description to refer to the same or like parts.

Embodiments of the present disclosure may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A,B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

A plurality of exemplary embodiments are provided below to describe the disclosure, though the disclosure is not limited to the provided exemplary embodiments, and the exemplary embodiments can also be suitably combined. A term "couple" used in the full text of the disclosure (including the claims) refers to any direct and indirect connections. For example, if a first device is described to be coupled to a second device, it is interpreted as that the first device is directly coupled to the second device, or the first device is indirectly coupled to the second device through other devices or connection means. Moreover, a term "signal" refers to at least a current, a voltage, an electric charge, a temperature, data or any other one or a plurality of signal.

Figure 1:
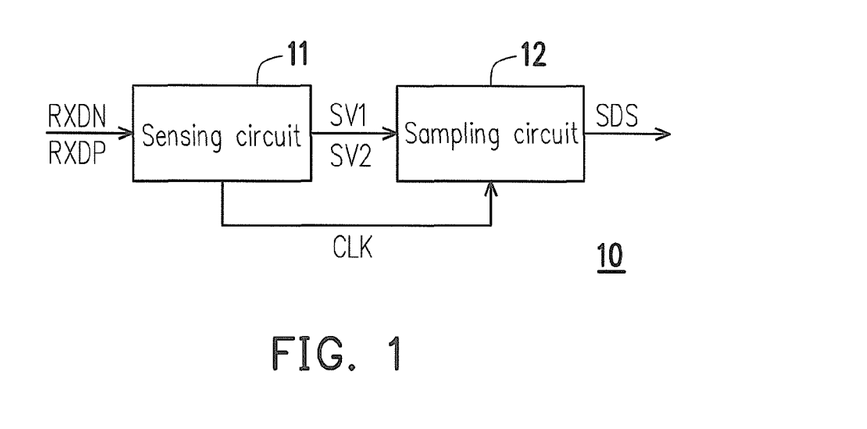
FIG. 1 is a schematic diagram illustrating a data sampling circuit module according to an exemplary embodiment of the disclosure.

FIG. 1 is a schematic diagram illustrating a data sampling circuit module according to an exemplary embodiment of the disclosure.

Referring to FIG. 1, a data sampling circuit module 10 includes a sensing circuit 11 and a sampling circuit 12.

The sensing circuit 11 is configured to receive differential signal RXDP and RXDN and generate a sensing voltage pair according to the differential signal RXDP and RXDN. In the present exemplary embodiment, the differential signal RXDP may be referred to as a first differential signal, the differential signal RXDN may be referred to as a second differential signal, and the differential signal RXDP and RXDN may be collectively referred to as a differential signal pair. In another exemplary embodiment, the differential signal RXDN may also be referred to as the first differential signal, and the differential signal RXDP may also be referred to as the second differential signal. Each of the differential signal RXDP and RXDN is a pulse width modulation signal generated by using a pulse width modulation (PWM) technique. Generally, amplitudes of the differential signal RXDP and RXDN are identical, but phases of the differential signal RXDP and RXDN are opposite.

The sensing voltage pair includes a sensing voltage SV1 (also known as a first sensing voltage) and a sensing voltage SV2 (also known as a second sensing voltage). A voltage value (also know as a first voltage value) of the sensing voltage SV1 is related to one of the differential signal RXDP and RXDN (e.g., the differential signal RXDP). A voltage value (also know as a second voltage value) of the sensing voltage SV2 is related to another one of the differential signal RXDP and RXDN (e.g., the differential signal RXDN). For example, the voltage value of the sensing voltage SV1 is related to a waveform of the differential signal RXDP, and the voltage value of the sensing voltage SV2 is related to a waveform of the differential signal RXDN.

In the present exemplary embodiment, the voltage value of the sensing voltage SV1, for example, positively correlates to a time length of the differential signal RXDP at logically high, and the voltage value of the sensing voltage SV2, for example, positively correlates to a time length of the differential signal RXDN at logically high. Alternatively, because the phases of the differential signal RXDP and RXDN are opposite, the voltage value of the sensing voltage SV1, for example, positively correlates to a time length of the differential signal RXDP at logically high, and the voltage value of the sensing voltage SV2, for example, positively correlates to a time length of the differential signal RXDP at logically low.

The sampling circuit 12 is coupled to the sensing circuit 11. The sampling circuit 12 is configured to receive the sensing voltage pair and output a sampling data stream SDS according to a clock of the differential signal RXDP and RXDN and a voltage relative relationship of the sensing voltage pair. In the present exemplary embodiment, the voltage relative relationship of the sensing voltage pair refers to either the voltage value of the sensing voltage SV1 is greater than or less than the voltage value of the sensing voltage SV2. In another exemplary embodiment, the voltage relative relationship of the sensing voltage pair may also refer to whether the voltage value of the sensing voltage SV1 is greater than a threshold, and/or whether the voltage value of the sensing voltage SV2 is less than said threshold or another threshold. Furthermore, in yet another exemplary embodiment, the voltage relative relationship of the sensing voltage pair may also be any meaningful numerical relationship, which is not particularly limited in the disclosure.

Specifically, the sampling circuit 12 samples the voltage value of the sensing voltage SV1 and the voltage value of the sensing voltage SV2 at a specific time point according to a clock CLK (or clock frequency) of the differential signal RXDP and RXDN. Generally, the bit data transmitted by the differential signal RXDP and RXDN uses one clock cycle as the units. For example, the pulses that belong to the same clock cycle are configured to transmit one bit data. Therefore, in the present exemplary embodiment, the specific time point is an edge of each clock cycle in the clock CLK. If the sampling circuit 12 determines that the voltage relative relationship of the sensing voltage pair belongs to a first type relationship, the sampling circuit 12 outputs first type sampling data (also known as first sampling data); if the sampling circuit 12 determines that the voltage relative relationship of the sensing voltage pair belongs to a second type relationship, the sampling circuit 12 outputs second type sampling data (also known as second sampling data). In the present exemplary embodiment, the first type sampling data refers to the bit "1", and the second type sampling data refers to the bit "0". In another exemplary embodiment, the first type sampling data refers to the bit "0", and the second type sampling data refers to the bit "1". However, in yet another exemplary embodiment, the sampling data of each type may also refer to a combination of multiple bits (e.g., "01" or "010", etc), which is not particularly limited in the disclosure. According to the clock CLK (or clock frequency) of the differential signal RXDP and RXDN, the sampling circuit 12 outputs the sampling data stream SDS having identical or similar clock (or clock frequency).

Figure 2:
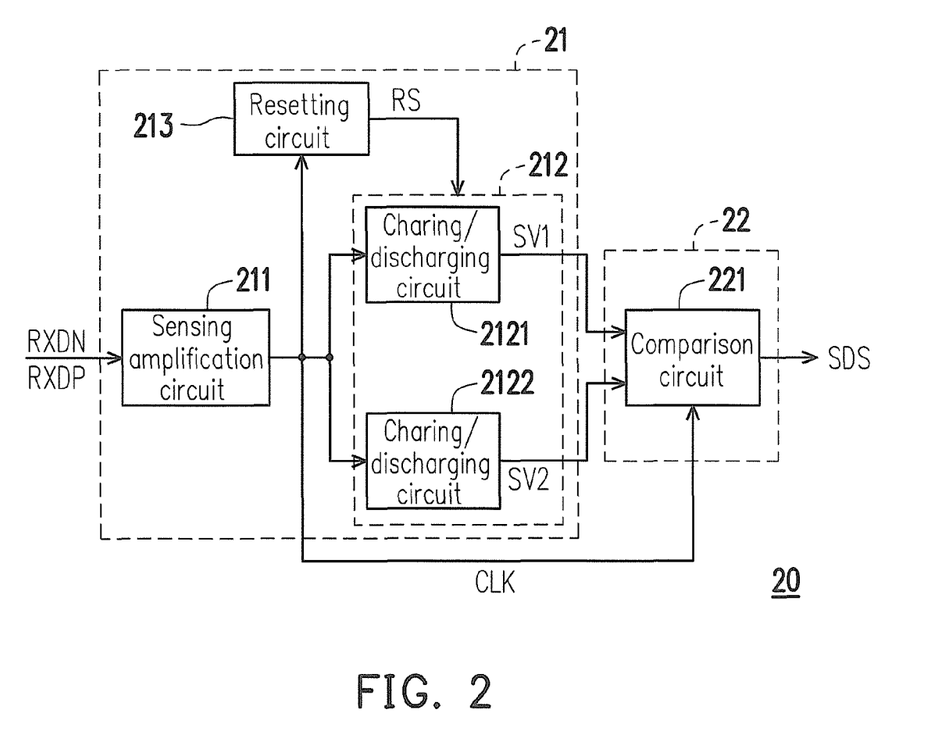
FIG. 2 is a schematic diagram illustrating a data sampling circuit module according to an exemplary embodiment of the disclosure.

FIG. 2 is a schematic diagram illustrating a data sampling circuit module according to an exemplary embodiment of the disclosure.

Referring to FIG. 2, a data sampling circuit module 20 includes a sensing circuit 21 and a sampling circuit 22. The sensing circuit 21 and the sampling circuit 22 may be identical or similar to the sensing circuit 11 and the sampling circuit 12 respectively. The sensing circuit 21 includes a sensing amplification circuit 211 and a voltage-to-current conversion circuit 212. The sampling circuit 22 includes a comparison circuit 221.

The sensing amplification circuit 211 is configured to receive the differential signal RXDP and RXDN and execute a sensing amplification for the differential signal RXDP and RXDN in order to output corrected pulse signal. As compared to the differential signal RXDP and RXDN, a signal strength and a noise reduction capability of the corrected pulse signal are both stronger. In addition, as compared to the waveforms of the differential signal RXDP and RXDN, waveforms of the corrected pulse signal may be closer to square signal. In the present exemplary embodiment, the corrected pulse signal includes a first corrected pulse signal and a second corrected pulse signal which are transmitted separately. The first corrected pulse signal is obtained by sensing and amplifying the differential signal RXDP, and the second corrected pulse signal is obtained by sensing and amplifying the differential signal RXDN. Further, in another exemplary embodiment, before the corrected pulse signal being inputted to the voltage-to-current conversion circuit 212, a phase reversal is executed in order to generate the first corrected pulse signal and the second corrected pulse signal which are opposite in phase.

The voltage-to-current conversion circuit 212 is coupled to the sensing amplification circuit 211. The voltage-to-current conversion circuit 212 is configured to receive the corrected pulse signal and execute a charging/discharging operation according to the corrected pulse signal in order to generate the sensing voltage pair.

Specifically, the voltage-to-current conversion circuit 212 includes a charging/discharging circuit 2121 and a charging/discharging circuit 2122. The charging/discharging circuit 2121 is configured to receive the first corrected pulse signal and execute the charging/discharging operation (also known as a first charging/discharging operation) according to the first corrected pulse signal in order to generate the sensing voltage SV1. The charging/discharging circuit 2122 is configured to receive the second corrected pulse signal and execute the charging/discharging operation (also known as a second charging/discharging operation) according to the second corrected pulse signal in order to generate the sensing voltage SV2.

The comparison circuit 221 is coupled to the charging/discharging circuit 2121 and the charging/discharging circuit 2122. The comparison circuit 221 is configured to receive the sensing voltage pair (i.e., the sensing voltages SV1 and SV2) and performs sampling for the voltage value of the sensing voltage SV1 and the voltage value of the sensing voltage SV2 at said specific time point according to the clock CLK of the differential signal RXDP and RXDN. The comparison circuit 221 compares the sampled voltage value of the sensing voltage SV1 and the sampled voltage value of the sensing voltage SV2 in order to obtain the voltage relative relationship of the sensing voltage pair. If the voltage relative relationship is the first voltage value SV1 being greater than the second voltage value SV2, the comparison circuit 221 decides and outputs the first sampling data. If the voltage relative relationship is the first voltage value SV1 being less than the second voltage value SV2, the comparison circuit 221 decides and outputs the second sampling data. The comparison circuit 221 may include one or more D-type flip-flops and may output the sampling data stream SDS according to the clock CLK of the differential signal RXDP and RXDN and the decided sampling data.

In the present exemplary embodiment, the sensing circuit 21 further includes a resetting circuit 213. The resetting circuit 213 is coupled to the sensing amplification circuit 211 and the voltage-to-current conversion circuit 212. The resetting circuit 213 is configured to reset the sensing voltage pair according to the clock of the differential signal RXDP and RXDN. For example, after each time the voltage value of the sensing voltage SV1 and the voltage value of the sensing voltage SV2 are obtained by the comparison circuit 221, the resetting circuit 213 sends a resetting signal RS to the charging/discharging circuit 2121 and the charging/discharging circuit 2122; the charging/discharging circuit 2121 and the charging/discharging circuit 2122 respectively adjust the voltage of the sensing voltage SV1 and the voltage value of the sensing voltage SV2 to be a preset value according to the resetting signal RS. Thereafter, the charging/discharging circuit 2121 and the charging/discharging circuit 2122 respectively start to execute said first charging/discharging operation and said second charging/discharging operation to adjusting the voltage values of the sensing voltages SV1 and SV2 from the preset value. However, in another exemplary embodiment, it is also possible that the sensing circuit 21 does not include the resetting circuit 213, which is not particularly limited in the disclosure.

Figure 3:
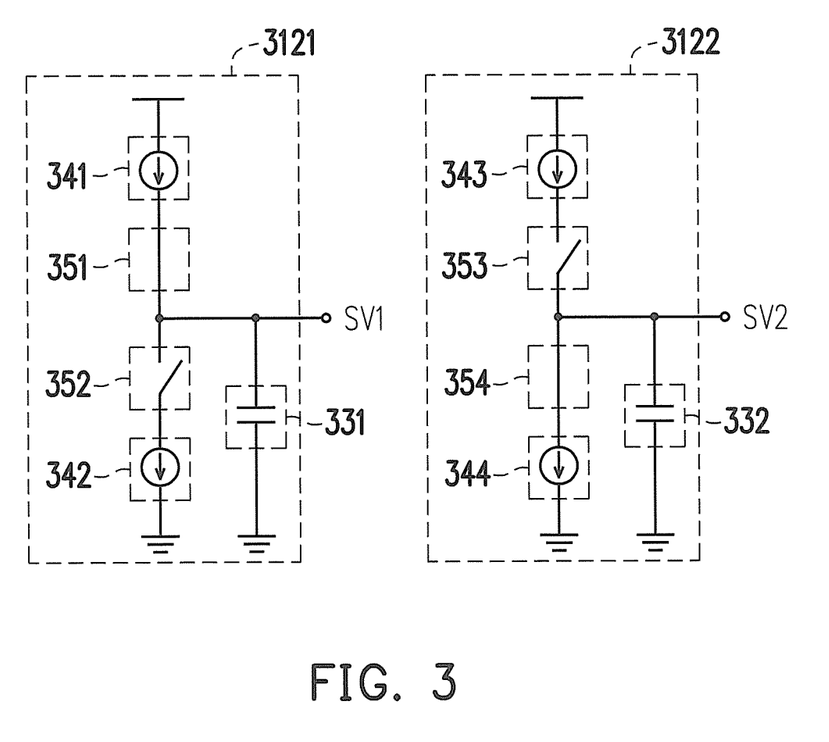
FIG. 3 is a schematic diagram illustrating a charging/discharging circuit according to an exemplary embodiment of the disclosure.

FIG. 3 is a schematic diagram illustrating a charging/discharging circuit according to an exemplary embodiment of the disclosure.

Referring to FIG. 3, a charging/discharging circuit 3121 and a charging/discharging circuit 3122 are identical or similar to the charging/discharging circuit 2121 and the charging/discharging circuit 2122 respectively.

The charging/discharging circuit 3121 includes a capacitor unit 331, a charging current source 341, a charging switch 351, a discharging current source 342 and a discharge switch 352.

The capacitor unit 331 includes electronic components configured to store electrical charges, such as one or more capacitors. A first terminal of the capacitor unit 331 is coupled to the sampling circuit 22, and a second terminal of the capacitor unit 331 is connected to the ground. Aforesaid sensing voltage SV1 refers to a potential difference between the two terminals of the capacitor unit 331. The charging current source 341 is configured to provide a charging current to the first terminal of the charging current 331. The charging switch 351 is serially connected to a charging path (also known as a first charging path) between the first terminal of the capacitor unit 331 and the charging current source 341 and configured to turn on or off the first charging path in response to the first corrected pulse signal. The discharging current source 342 is configured to provide a discharging current to the ground. The discharging switch 352 is serially connected to a discharging path (also known as a first discharging path) between the first terminal of the capacitor unit 331 and the discharging current source 342 and configured to turn off or on the first discharging path in response to the first corrected pulse signal. In the present exemplary embodiment, if the voltage of the first corrected pulse signal is logically high, the charging switch 351 turns on the first charging path, the discharging switch 352 cuts off the first discharging path, and the charging current source 341 charges the capacitor unit 331 (as shown in FIG. 3); if the voltage of the first corrected pulse signal is logically low, the charging switch 351 cuts off the first charging path, the discharging switch 352 turns on the first discharging path, and the discharging current source 342 discharges the capacitor unit 331.

The charging/discharging circuit 3122 includes a capacitor unit 332, a charging current source 343, a charging switch 353, a discharging current source 344 and a discharge switch 354.

The capacitor unit 332 includes electronic components configured to store electrical charges, such as one or more capacitors. A first terminal of the capacitor unit 332 is coupled to the sampling circuit 12, and a second terminal of the capacitor unit 332 is connected to the ground. Aforesaid sensing voltage SV2 refers to a potential difference between the two terminals of the capacitor unit 332. The charging current source 343 is configured to provide a charging current to the first terminal of the charging current 332. The charging switch 353 is serially connected to a charging path (also known as a second charging path) between the first terminal of the capacitor unit 332 and the charging current source 343 and configured to turn on or off the second charging path in response to the second corrected pulse signal. The discharging current source 344 is configured to provide a discharging current to the ground. The discharging switch 354 is serially connected to a discharging path (also known as a second discharging path) between the first terminal of the capacitor unit 332 and the discharging current source 344 and configured to turn off or on the second discharging path in response to the second corrected pulse signal. In the present exemplary embodiment, if the voltage of the second corrected pulse signal is logically high, the charging switch 353 turns on the second charging path, the discharging switch 354 cuts off the second discharging path, and the charging current source 343 charges the capacitor unit 332; if the voltage of the second corrected pulse signal is logically low, the charging switch 353 cuts off the second charging path, the discharging switch 354 turns on the second discharging path, and the discharging current source 344 discharges the capacitor unit 332 (as shown in FIG. 3).

In other words, because the first corrected pulse signal and the second corrected pulse signal are opposite in phase, when the first charging path and the second discharging path are turned on, the first discharging path and the second charging path are cut off (as shown in FIG. 3); when the first discharging path and the second charging path are turned on, the first charging path and the second discharging path are cut off.

Figure 4:
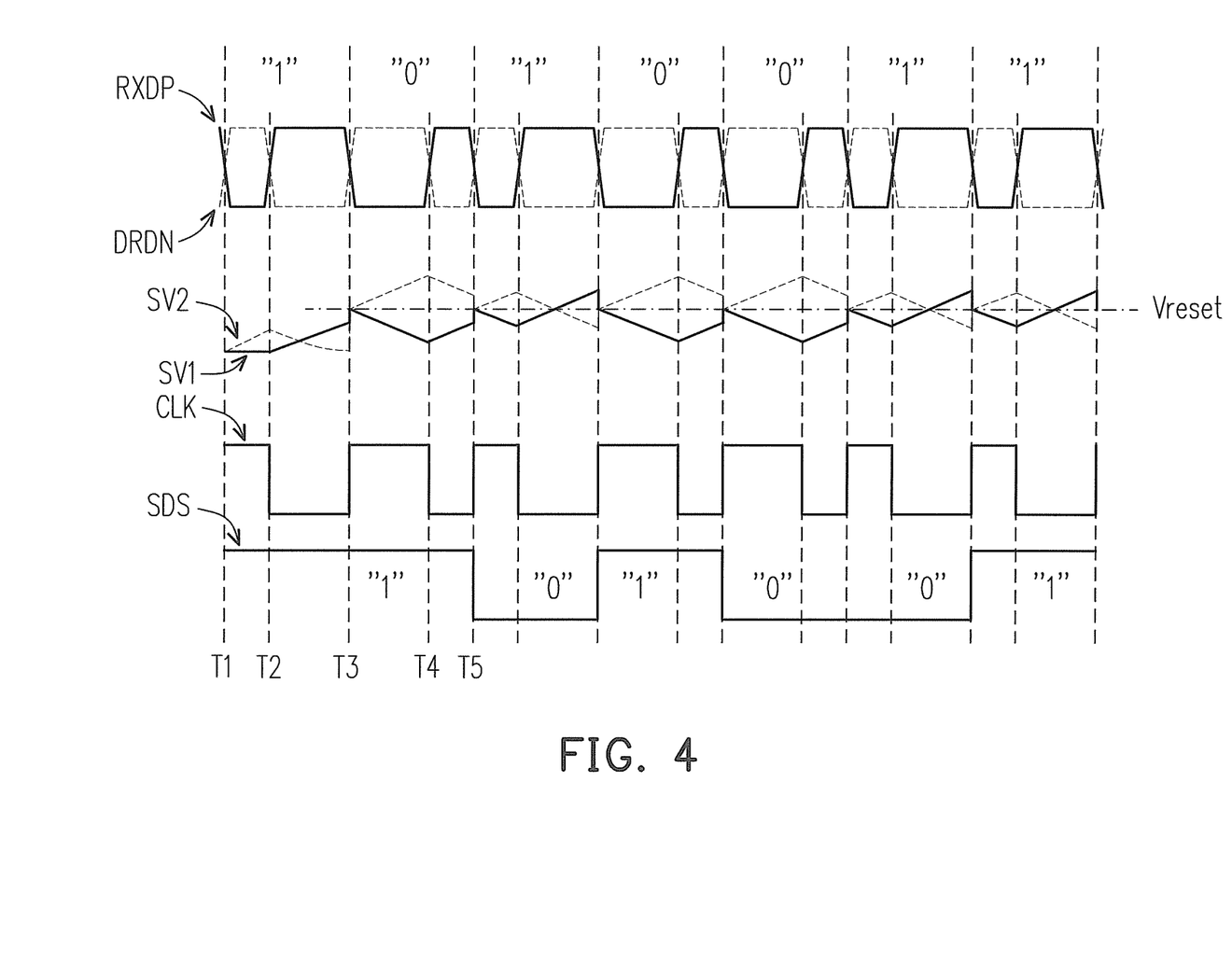
FIG. 4 is a schematic diagram illustrating signal waveform is according to an exemplary embodiment of the disclosure.

FIG. 4 is a schematic diagram illustrating signal waveforms according to an exemplary embodiment of the disclosure.

Referring to FIG. 4, herein, the differential signal RXDP and RXDN are represented by a solid line and a dashed line respectively. The differential signal RXDP and RXDN are used together, and it is assumed that differential signal RXDP and RXDN are configured to sequentially transmit bit data "1", "0", "1 1" and "1".

At a time point T1, in response to the first corrected pulse signal (or, the differential signal RXDP) which is logically low, the first charging path is cut off, the first discharging path is turned on, and the discharging current source 342 discharges the capacitor unit 331 via the first discharging path; meanwhile, in response to the second corrected pulse signal (or, the differential signal RXDN) which is logically high, the second charging path is turned on, the second discharging path is cut off, and the charging current source 343 starts to charge the capacitor unit 332 via the second charging path.

At a time point T2, in response to the first corrected pulse signal (or, the differential signal RXDP) which is logically high, the first charging path is turned on, the first discharging path is cut off, and the charging current source 341 starts to charge the capacitor unit 331 via the first charging path; meanwhile, in response to the second corrected pulse signal (or, the differential signal RXDN) which is logically low, the second charging path is cut off, the second discharging path is turned on, and the discharging current source 344 starts to discharge the capacitor unit 332 via the second discharging path.

At a time point T3 (i.e., the specific time point), according to the clock CLK of the differential signal RXDP and RXDN, the voltage values of sensing voltages SV1 and SV2 are sampled and compared with each other. Herein, because the sampled voltage value of the sensing voltage SV1 is greater than the sampled voltage value of the sensing voltage SV2, the first sampling data (i.e., bit "1") is decided and outputted. On the other hand, after sampling the voltage values of the sensing voltages SV1 and SV2, the voltage values of the sensing voltages SV1 and SV2 are reset to be a preset value $V_{reset}$. Thereafter, in response to the first corrected pulse signal (or, the differential signal RXDP) which is logically low, the first charging path is cut off, the first discharging path is turned on, and the discharging current source 342 discharges the capacitor unit 331 via the first discharging path; meanwhile, in response to the second corrected pulse signal (or, the differential signal RXDN) which is logically high, the second charging path is turned on, the second discharging path is cut off, and the charging current source 343 starts to charge the capacitor unit 332 via the second charging path.

At a time point T4, in response to the first corrected pulse signal (or, the differential signal RXDP) which is logically high, the first charging path is turned on, the first discharging path is cut off, and the charging current source 341 starts to charge the capacitor unit 331 via the first charging path; meanwhile, in response to the second corrected pulse signal (or, the differential signal RXDN) which is logically low, the second charging path is cut off, the second discharging path is turned on, and the discharging current source 344 starts to discharge the capacitor unit 332 via the second discharging path.

At a time point T5 (i.e., the specific time point), according to the clock CLK of the differential signal RXDP and RXDN, the voltage values of sensing voltages SV1 and SV2 are sampled and compared with each other. Herein, because the sampled voltage value of the sensing voltage SV1 is less than the sampled voltage value of the sensing voltage SV2, the second sampling data (i.e., bit "0") is decided and outputted. On the other hand, after sampling the voltage values of the sensing voltages SV1 and SV2, the voltage values of the sensing voltages SV1 and SV2 are reset again to be the preset value $V_{reset}$. Thereafter, in response to the first corrected pulse signal (or, the differential signal RXDP) which is logically low, the first charging path is cut off, the first discharging path is turned on, and the discharging current source 342 discharges the capacitor unit 331 via the first discharging path; meanwhile, in response to the second corrected pulse signal (or, the differential signal RXDN) which is logically high, the second charging path is turned on, the second discharging path is cut off, and the charging current source 343 starts to charge the capacitor unit 332 via the second charging path. Subsequent operations for outputting the bit data "1", "0", "0", "1" and "1" may be inferred with reference to FIG. 4 and aforementioned operations, which are not repeatedly described hereinafter.

It should be noted that, circuities depicted in FIG. 2 and FIG. 3 are merely exemplary embodiments of the disclosure. In another exemplary embodiment, any useful electronic components may be added to the circuities depicted in FIG. 2 and FIG. 3 additionally. Alternatively, a part of the electronic components may also be removed from the circuities depicted in FIG. 2 or FIG. 3, which is not particularly limited in the disclosure.

Figure 5:
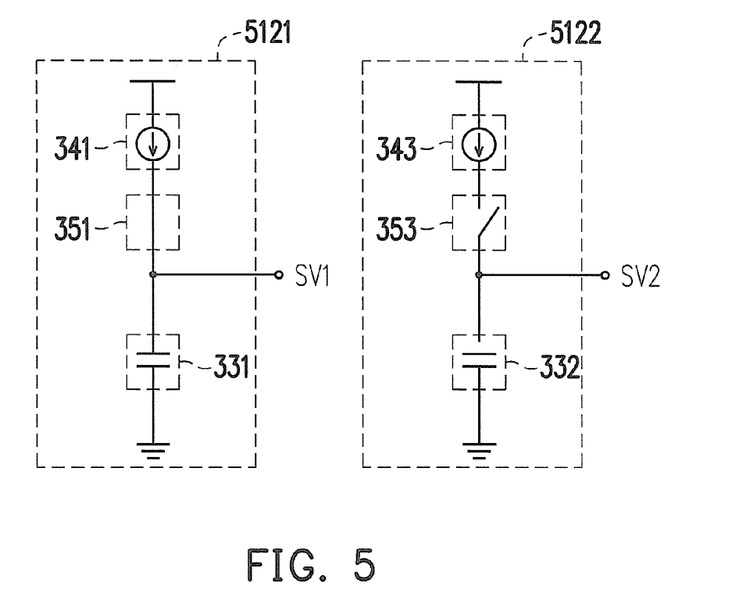
FIG. 5 is a schematic diagram illustrating a charging/discharging circuit according to another exemplary embodiment of the disclosure.

FIG. 5 is a schematic diagram illustrating a charging/discharging circuit according to another exemplary embodiment of the disclosure.

Referring to FIG. 5, a difference between the present exemplary embodiment and the exemplary embodiment of FIG. 3 is that, neither of said first discharging path and said second discharging exist in charging/discharging circuits of the present exemplary embodiment. In other words, in the present exemplary embodiment, a charging/discharging circuit 5121 includes the capacitor unit 331, the charging current source 341 and the charging switch 351, and a charging/discharging circuit 5122 includes the capacitor unit 332, the charging current source 343 and the charging switch 353. The capacitor unit 331, the charging current source 341, the charging switch 351, the capacitor unit 332, the charging current source 343 and the charging switch 353 have been described in the exemplary embodiment of FIG. 3, which are not repeated hereinafter. The charging/discharging circuits 2121 and 2122 of FIG. 2 may selectively adopt use of implementations of FIG. 3 or FIG. 5, which is not particularly limited in the disclosure. Furthermore, any useful electronic components may be added to the circuitry depicted in FIG. 5, which are not particularly limited in the disclosure.

Figure 6:
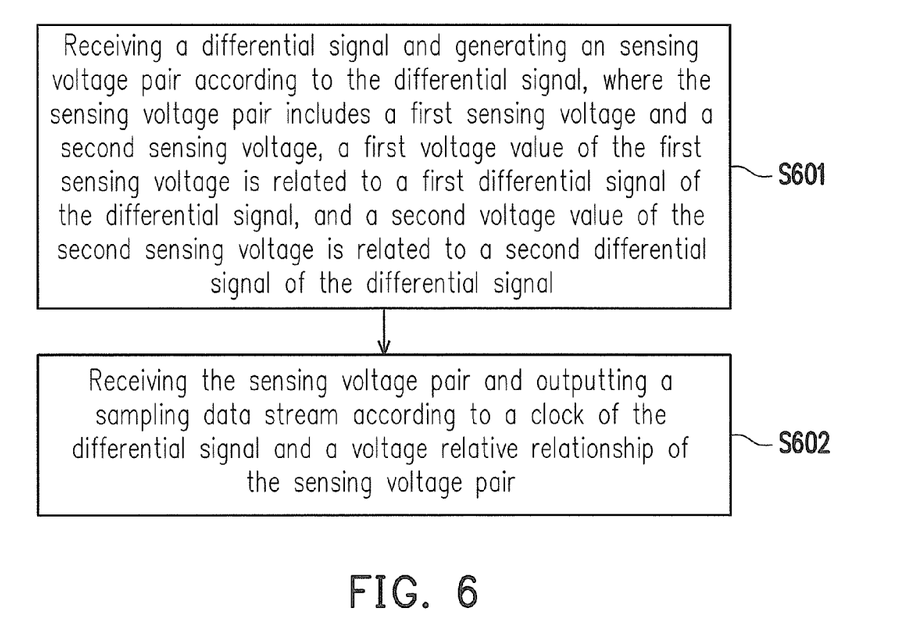
FIG. 6 is a flowchart illustrating a data sampling method according to an exemplary embodiment of the disclosure.

FIG. 6 is a flowchart illustrating a data sampling method according to an exemplary embodiment of the disclosure.

Referring to FIG. 6, in step S601, the differential signal is received and a sensing voltage pair is generated according to the differential signal, where the sensing voltage pair includes a first sensing voltage and a second sensing voltage, a first voltage value of the first sensing voltage is related to a first differential signal of the differential signal, and a second voltage value of the second sensing voltage is related to a second differential signal of the differential signal. In step S602, the sensing voltage pair is received and a sampling data stream is outputted according to a clock of the differential signal and a voltage relative relationship of the sensing voltage pair.

Nevertheless, steps depicted in FIG. 6 are already described in detail above, thus related descriptions thereof are omitted hereinafter. It should be noted that, the steps depicted in FIG. 6 may be implemented as a plurality of program codes or circuits, which are not particularly limited in the disclosure. Moreover, the method disclosed in FIG. 6 may be implemented by reference with above exemplary embodiments, or may be implemented separately, which are not particularly limited in the disclosure.

In the present exemplary embodiment, the proposed data sampling circuit module and the data sampling method are used in a memory storage device (also known as a memory storage system), or used in a memory controlling circuit unit for controlling the memory storage device. However, in another exemplary embodiment, the proposed data sampling circuit module and the data sampling method may also be used in various electronic devices or communication devices such as smart phones, tablet computers and notebook computers, which are not particularly limited in the disclosure.

Generally, the memory storage device includes a rewritable non-volatile memory module and a controller (also known as the control circuit). The memory storage device is usually configured together with a host system so that the host system may write data into or read data from the memory storage device.

Figure 7:
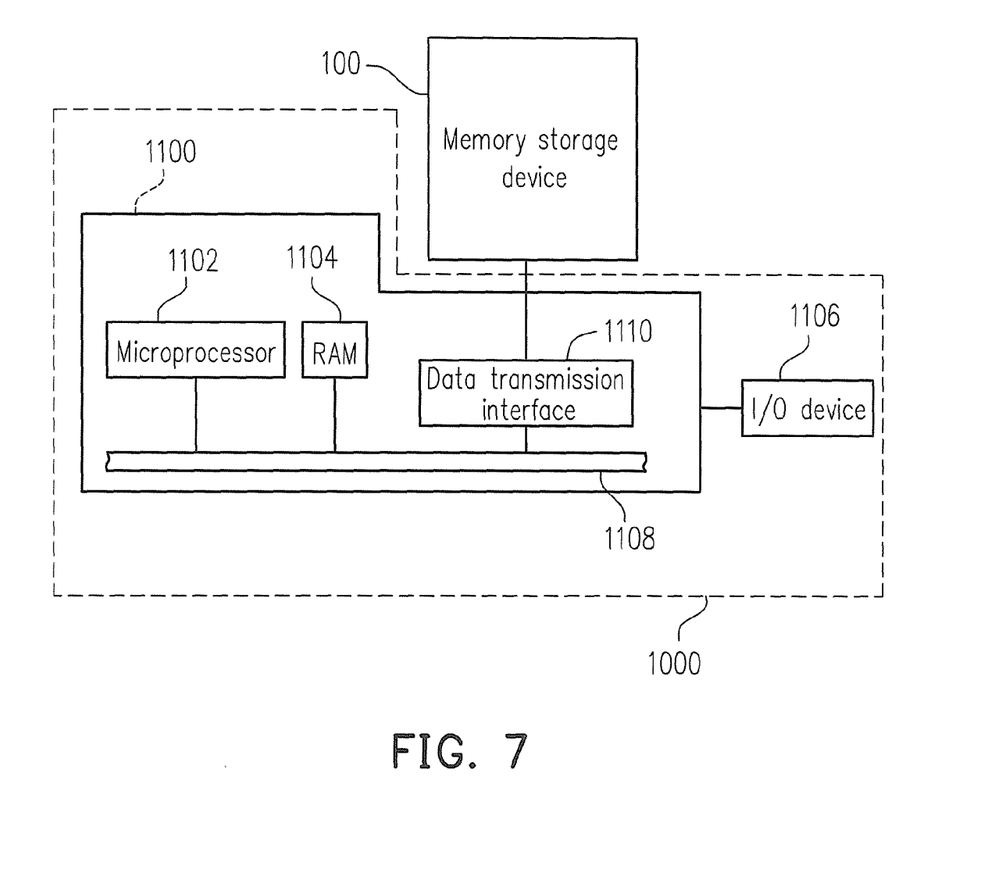
FIG. 7 is a schematic diagram illustrating a host system and a memory storage device according to an exemplary embodiment of the disclosure.
Figure 8:
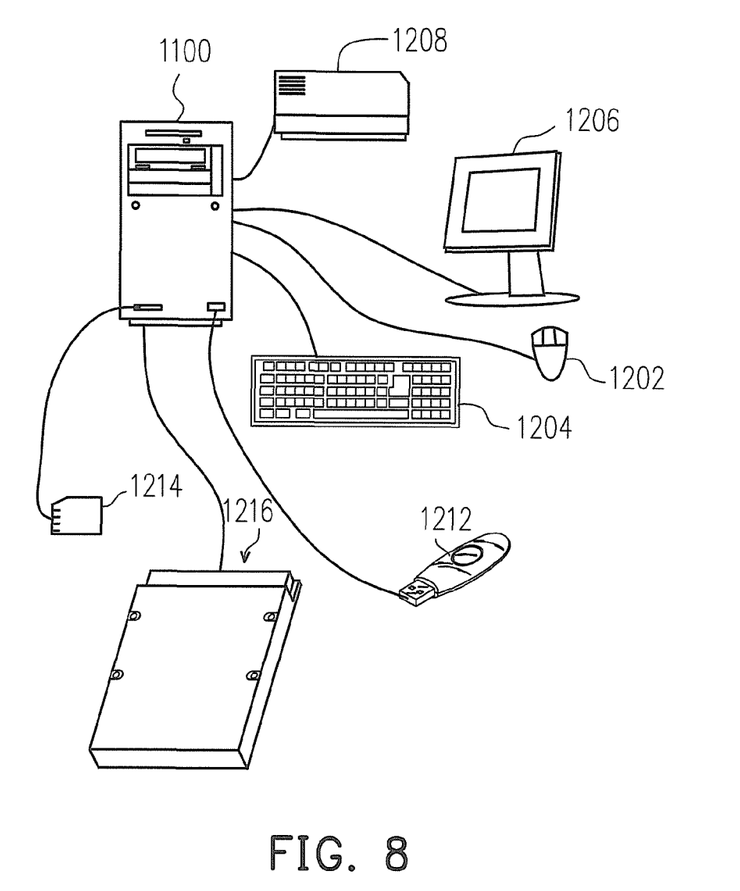
FIG. 8 is a schematic diagram illustrating a computer system and an input/output device according to an exemplary embodiment of the disclosure.
Figure 9:
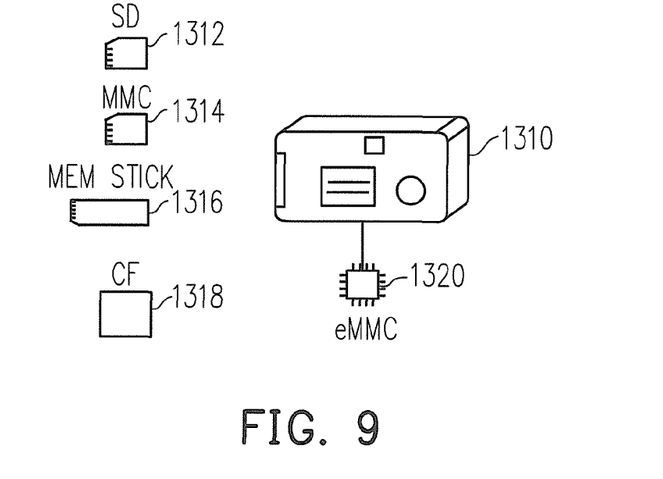
FIG. 9 is a schematic diagram illustrating a host system and a memory storage device according to an exemplary embodiment of the disclosure.

FIG. 7 is a schematic diagram illustrating a host system and a memory storage device according to an exemplary embodiment of the disclosure. FIG. 8 is a schematic diagram illustrating a computer system and an input/output device according to an exemplary embodiment of the disclosure. FIG. 9 is a schematic diagram illustrating a host system and a memory storage device according to an exemplary embodiment of the disclosure.

Referring to FIG. 7, a host system 1000 generally includes a computer 1100 and an input/output (I/O) device 1106. The computer 1100 includes a microprocessor 1102, a random access memory (RAM) 1104, a system bus 1108, and a data transmission interface 1110. For example, the I/O device 1106 includes a mouse 1202, a keyboard 1204, a display 1206 and a printer 1208 as shown in FIG. 2. It should be understood that the devices illustrated in FIG. 8 are not intended to limit the I/O device 1106, and the I/O device 1106 may further include other devices.

The memory storage device 100 is coupled to other devices of the host system 1000 through the data transmission interface 1110. By using the microprocessor 1102, the random access memory (RAM) 1104 and the Input/Output (I/O) device 1106, data may be written into the memory storage device 100 or may be read from the memory storage device 100. For example, the memory storage device 100 may be a rewritable non-volatile memory storage device such as a flash drive 1212, a memory card 1214, or a solid state drive (SSD) 1216 as shown in FIG. 8.

Generally, the host system 1000 may substantially be any system capable of cooperating with the memory storage device 100 for storing data. Even though the host system 1000 is illustrated as a computer system in the present exemplary embodiment, in another exemplary embodiment of the present disclosure, the host system 1000 may be a digital camera, a video camera, a telecommunication device, an audio player, or a video player. For example, when the host system is a digital camera (video camera) 1310, the rewritable non-volatile memory storage device may be a SD card 1312, a MMC card 1314, a memory stick 1316, a CF card 1318 or an embedded storage device 1320 (as shown in FIG. 9). The embedded storage device 1320 includes an embedded MMC (eMMC). It should be mentioned that the eMMC is directly coupled to a substrate of the host system.

Figure 10:
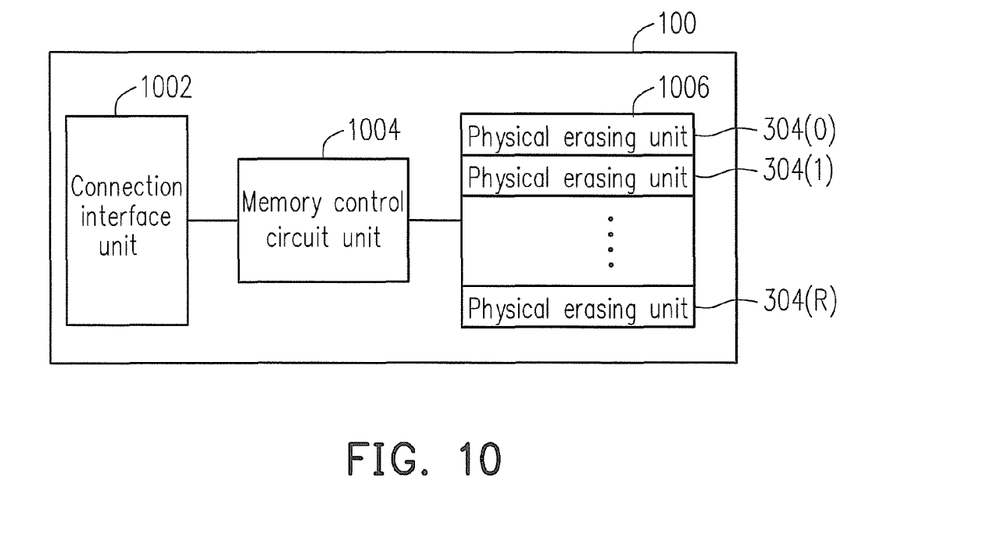
FIG. 10 is a schematic block diagram illustrating the memory storage device depicted in FIG. 7.

FIG. 10 is a schematic block diagram illustrating the memory storage device depicted in FIG. 7.

Referring to FIG. 10, the memory storage device 100 includes a connection interface unit 1002, a memory controlling circuit unit 1004 and a rewritable non-volatile memory module 1006.

In the present exemplary embodiment, the connection interface unit 1002 is compatible with a serial advanced technology attachment (SATA) standard. However, the disclosure is not limited thereto, and the connection interface unit 1002 may also be compatible to Parallel Advanced Technology Attachment (PATA) standard, Institute of Electrical and Electronic Engineers (IEEE) 1394 standard, Peripheral Component Interconnect (PCI) Express interface standard, Universal Serial Bus (USB) standard, Ultra High Speed-I (UHS-I) interface standard, Ultra High Speed-II (UHS-II) interface standard, Secure Digital (SD) interface standard, Memory Stick (MS) interface standard, Multi Media Card (MMC) interface standard, Compact Flash (CF) interface standard, Integrated Device Electronics (IDE) interface standard or other suitable standards. In the present exemplary embodiment, the connection interface unit and the memory controlling circuit unit may be packaged into one chip, or distributed outside of a chip containing the memory controlling circuit unit.

In an exemplary embodiment, the data sampling circuit module 10 or 20 is disposed in the connection interface unit 1002, so as to receive the differential signal RXDP and RXDN from the host system 1000 and output the corresponding sampling data stream SDS for the memory controlling circuit unit 1004 to use.

The memory controlling circuit unit 1004 is configured to execute a plurality of logic gates or control commands which are implemented in a hardware form or in a firmware form, so as to execute operations of writing, reading or erasing data in the rewritable non-volatile memory storage module 1006 according to the commands of the host system 1000.

The rewritable non-volatile memory module 1006 is coupled to the memory controlling circuit unit 1004 and configured to store data written from the host system 1000. The rewritable non-volatile memory storage module 1006 includes multiple physical erasing units 304(0) to 304(R). The physical erasing units 304(0) to 304(R) may belong to the same memory die or belong to different memory dies. Each physical erasing unit has a plurality of physical programming units, and the physical programming units of the same physical erasing unit may be written separately and erased simultaneously. In the present exemplary embodiment, each physical erasing unit is composed of 64 physical programming units. However, in other exemplary embodiments of the disclosure, each of the physical erasing units is composed of 128 or 256 physical programming units or any other amount of the physical programming units.

More specifically, the physical programming unit is the minimum unit for programming. That is, the physical programming unit is the minimum unit for writing data. For example, the physical programming unit is a physical page or a physical sector. When the physical programming unit is the physical page, the physical programming unit usually includes a data bit area and a redundancy bit area. The data bit area has multiple physical sectors configured to store user data, and the redundant bit area is configured to store system data (e.g., an error correcting code). In the present exemplary embodiment, each of the data bit areas contains 32 physical sectors, and a size of each physical sector is 512-byte (B). However, in other exemplary embodiments, the data bit area may also include 8, 16, or more or less of the physical sectors, and amount and sizes of the physical sectors are not limited in the disclosure. On the other hand, the physical erasing unit is the minimal unit for erasing. Namely, each physical erasing unit contains the least number of memory cells to be erased together. For instance, the physical erasing unit is a physical block.

In the present exemplary embodiment, the rewritable non-volatile memory module 1006 is a Multi Level Cell (MLC) NAND flash memory module (i.e., a flash memory module capable of storing two bits of data in one memory cell). However, the disclosure is not limited thereto. The rewritable non-volatile memory module 1006 may also be a Single Level Cell (SLC) NAND flash memory module, (i.e., a flash memory module capable of storing one bit of data in one memory cell), a Trinary Level Cell (TLC) NAND flash memory module (i.e., a flash memory module capable of storing three bits of data in one memory cell), other flash memory modules or any memory module having the same features.

Figure 11:
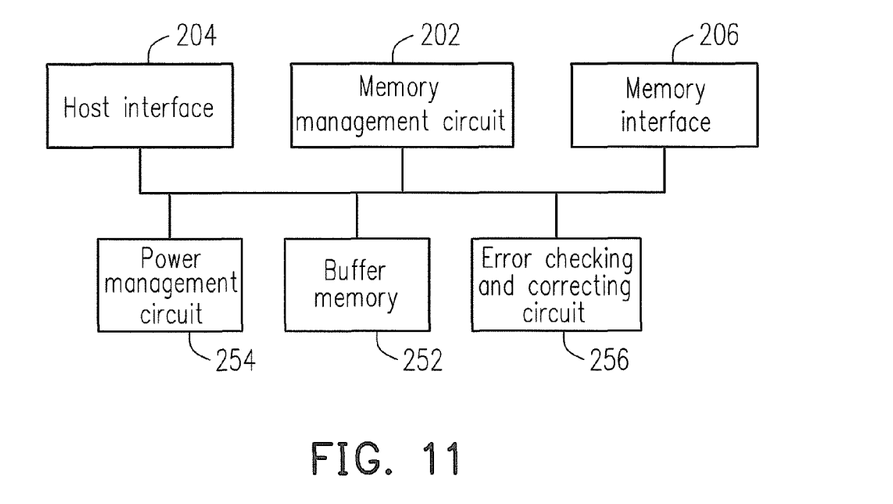
FIG. 11 is a schematic block diagram illustrating a memory controlling circuit unit according to an exemplary embodiment of the disclosure.

FIG. 11 is a schematic block diagram illustrating a memory controlling circuit unit according to an exemplary embodiment of the disclosure.

Referring to FIG. 11, the memory controlling circuit unit 1004 includes a memory management circuit 202, a host interface 204 and a memory interface 206.

The memory management circuit 202 is configured to control overall operations of the memory controlling circuit unit 1004. Specifically, the memory management circuit 202 has a plurality of control commands. During operations of the memory storage device 100, the control commands are executed to execute various operations such as writing, reading and erasing data.

In the present exemplary embodiment, the control commands of the memory management circuit 202 are implemented in a form of a firmware. For instance, the memory management circuit 202 has a microprocessor unit (not illustrated) and a ROM (not illustrated), and the control commands are burned into the ROM. When the memory storage device 100 operates, the control commands are executed by the microprocessor to perform operations of writing, reading or erasing data.

In another exemplary embodiment of the disclosure, the control commands of the memory management circuit 202 may also be stored as program codes in a specific area (for example, the system area in a memory exclusively used for storing system data) of the rewritable non-volatile memory module 1006. In addition, the memory management circuit 202 has a microprocessor unit (not illustrated), a ROM (not illustrated) and a RAM (not illustrated). Particularly, the ROM has an activate code, which is executed by the microprocessor unit to load the control commands stored in the rewritable non-volatile memory module 1006 to the RAM of the memory management circuit 202 when the memory controlling circuit unit 1004 is enabled. Thereafter, the control commands are executed by the microprocessor unit to execute operations of writing, reading or erasing data.

Further, in another exemplary embodiment of the disclosure, the control commands of the memory management circuit 202 may also be implemented in a form of hardware. For example, the memory management circuit 202 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory management circuit is configured to manage the physical erasing units of the rewritable non-volatile memory module 1006; the memory writing circuit is configured to issue a write command to the rewritable non-volatile memory module 1006 in order to write data into the rewritable non-volatile memory module 1006; the memory reading circuit is configured to issue a read command to the rewritable non-volatile memory module 1006 in order to read data from the rewritable non-volatile memory module 1006; the memory erasing circuit is configured to issue an erase command to the rewritable non-volatile memory module 1006 in order to erase data from the rewritable non-volatile memory module 1006; the data processing circuit is configured to process both the data to be written to the rewritable non-volatile memory module 1006 and the data to be read from the rewritable non-volatile memory module 1006.

The host interface 204 is coupled to the memory management circuit 202 and configured for receiving and identifying commands and data sent from the host system 1000. In other words, the commands and data sent from the host system 1000 are passed to the memory management circuit 202 through the host interface 204. In the present exemplary embodiment, the host interface 204 is compatible with the SATA standard. However, it should be understood that the present disclosure is not limited thereto, and the host interface 204 may also be compatible with a PATA standard, an IEEE 1394 standard, a PCI Express standard, a USB standard, a UHS-I standard, a UHS-II standard, a SD standard, a MS standard, a MMC standard, a CF standard, an IDE standard, or other suitable standards for data transmission.

The memory interface 206 is coupled to the memory management circuit 202 and configured to access the rewritable non-volatile memory module 1006. In other words, data to be written to the rewritable non-volatile memory module 1006 is converted to a format acceptable to the rewritable non-volatile memory module 1006 through the memory interface 206. Specifically, if the memory management circuit 202 intends to access the rewritable non-volatile memory module 1006, the memory interface 206 sends corresponding command sequences. The command sequences may include one or more signal, or data from the bus. For example, in a read command sequence, information such as identification codes and memory addresses are included.

In an exemplary embodiment, the memory controlling circuit unit 1004 further includes a buffer memory 252, a power management circuit 254 and an error checking and correcting circuit 256.

The buffer memory 252 is coupled to the memory management circuit 202 and configured to temporarily store data and commands from the host system 1000 or data from the rewritable non-volatile memory module 1006.

The power management unit 254 is coupled to the memory management circuit 202 and configured to control a power of the memory storage device 100.

The error checking and correcting circuit 256 is coupled to the memory management circuit 202 and configured to execute an error checking and correcting process to ensure the correctness of data. Specifically, when the memory management circuit 202 receives a write command from the host system 1000, the error checking and correcting circuit 256 generates an error checking and correcting code (ECC code) for data corresponding to the write command, and the memory management circuit 202 writes data and the ECC code corresponding to the write command to the rewritable non-volatile memory module 1006. Subsequently, when the memory management circuit 202 reads the data from the rewritable non-volatile memory module 1006, the error checking and correcting code corresponding to the data is also read, and the error checking and correcting circuit 256 may execute the error checking and correcting procedure for the read data according to the error checking and correcting code.

It is worth mentioning that, in an exemplary embodiment, if the memory controlling circuit unit 1004 or the memory storage device 100 is in an abnormal operating mode such as hibernate, standby or low-power mode, the host system 1000 may send a wake-up signal to the memory storage device 100. The wake-up signal is configured to wake up the memory controlling circuit unit 1004 or the memory storage device 100 from the abnormal operating mode such as hibernate, standby or low-power mode. By using the data sampling circuit module 10 or 20, the memory management circuit 202 is capable of correctly identifying whether the signal from the host system 1000 is the wake-up signal. If the memory management circuit 202 determines that the signal from the host system 1000 is the wake-up signal, the memory management circuit 202 then switches the memory controlling circuit unit 1004 or the memory storage device 1000 to a normal operating mode.

In an exemplary embodiment, in response to the operating mode of the memory controlling circuit unit 1004 or the memory storage device 100, whether to activate the data sampling circuit module 10 is decided by the data sampling circuit module 10 itself or by the memory controlling circuit unit 1004. For example, when the memory controlling circuit unit 1004 or the memory storage device 100 is in the abnormal operating mode such as hibernate, standby or low-power mode, the data sampling circuit module 10 is activated; and when the memory controlling circuit unit 1004 or the memory storage device 100 is in the normal operating mode, the data sampling circuit module 10 is not activated. However, in another exemplary embodiment, the data sampling circuit module 10 is always activated. For example, in response to the memory storage device 100 being powered on or started up, the data sampling circuit module 10 is activated until the memory storage device 100 is powered off or shut down.

In summary, after receiving the differential signal, the disclosure is capable of executing the charging/discharging operation according to the differential signal in order to generate related sensing voltage pair. Then, the disclosure is capable of sampling the voltage values of the sensing voltage pair according to the clock of the differential signal, and further outputting the sampling data stream according to the voltage relative relationship of the sensing voltage pair. As a result, the efficiency for processing the received differential signal may be improved.

The previously described exemplary embodiments of the present disclosure have the advantages aforementioned, wherein the advantages aforementioned not required in all versions of the disclosure.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A data sampling circuit module, comprising:
  a sensing circuit, configured to receive a differential signal and generate a sensing voltage pair according to the differential signal, wherein the sensing voltage pair comprises a first sensing voltage and a second sensing voltage, a first voltage value of the first sensing voltage is related to a first differential signal of the differential signal, and a second voltage value of the second sensing voltage is related to a second differential signal of the differential signal, wherein a first phase of the first differential signal and a second phase of the second differential signal are opposite; and
  a sampling circuit, coupled to the sensing circuit, wherein the sampling circuit is configured to receive the sensing voltage pair and output a sampling data stream according to a clock of the differential signal and a voltage relative relationship of the sensing voltage pair.

2. The data sampling circuit module of claim 1, wherein the sensing circuit comprises:
  a sensing amplification circuit, configured to receive the differential signal and execute a sensing amplification for the differential signal in order to output a corrected pulse signal; and
  a voltage-to-current conversion circuit, coupled to the sensing amplification circuit, wherein the voltage-to-current conversion circuit is configured to receive the corrected pulse signal and execute a charging/discharging operation according to the corrected pulse signal in order to generate the sensing voltage pair.

3. The data sampling circuit module of claim 2, wherein the voltage-to-current conversion circuit comprises:
  a first charging/discharging circuit, configured to receive a first corrected pulse signal of the corrected pulse signal and execute a first charging/discharging operation according to the first corrected pulse signal in order to generate the first sensing voltage; and
  a second charging/discharging circuit, configured to receive a second corrected pulse signal of the corrected pulse signal and execute a second charging/discharging operation according to the second corrected pulse signal in order to generate the second sensing voltage.

4. The data sampling circuit module of claim 3, wherein the first charging/discharging circuit comprises:
  a first capacitor unit, wherein the first sensing voltage refers to a first potential difference of the first capacitor unit;
  a first charging current source; and
  a first charging switch, serially connected to a first charging path between the first capacitor unit and the first charging current source and configured to turn on or off the first charging path in response to the first corrected pulse signal.

5. The data sampling circuit module of claim 4, wherein the first charging/discharging circuit further comprises:
  a first discharging current source; and
  a first discharging switch, serially connected to a first discharging path between the first capacitor unit and the first discharging current source and configured to turn off or on the first discharging path in response to the first corrected pulse signal.

6. The data sampling circuit module of claim 3, wherein the second charging/discharging circuit comprises:
  a second capacitor unit, wherein the second sensing voltage refers to a second potential difference of the second capacitor unit;
  a second charging current source; and
  a second charging switch, serially connected to a second charging path between the second capacitor unit and the second charging current source and configured to turn on or off the second charging path in response to the second corrected pulse signal.

7. The data sampling circuit module of claim 6, wherein the second charging/discharging circuit further comprises:
  a second discharging current source; and
  a second discharging switch, serially connected to a second discharging path between the second capacitor unit and the second discharging current source and configured to turn off or on the second discharging path in response to the second corrected pulse signal.

8. The data sampling circuit module of claim 1, wherein the sampling circuit comprises:
  a comparison circuit, configured to receive the sensing voltage pair and compare the first voltage value and the second voltage value according to the clock of the differential signal in order to obtain the voltage relative relationship,
  wherein if the voltage relative relationship is the first voltage value being greater than the second voltage value, the comparison circuit outputs first sampling data,
  wherein if the voltage relative relationship is the first voltage value being less than the second voltage value, the comparison circuit outputs second sampling data.

9. The data sampling circuit module of claim 2, wherein the sensing circuit further comprises:
  a resetting circuit, coupled to the sensing amplification circuit and the voltage-to-current conversion circuit and configured to reset the sensing voltage pair according to the clock of the differential signal.

10. The data sampling circuit module of claim 1, wherein the differential signal is a pulse width modulation signal generated by using a pulse width modulation technique.

11. The data sampling circuit module of claim 1, wherein the data sampling circuit module is disposed in a memory storage device,
  wherein when the memory storage device or a memory controlling circuit unit of the memory storage device is in an abnormal operating mode, the data sampling circuit module is activated,
  wherein when the memory storage device or the memory controlling circuit unit is in a normal operating mode, the data sampling circuit module is not activated.

12. A data sampling method, comprising:
  receiving a differential signal and generating a sensing voltage pair according to the differential signal, wherein the sensing voltage pair comprises a first sensing voltage and a second sensing voltage, a first voltage value of the first sensing voltage is related to a first differential signal of the differential signal, and a second voltage value of the second sensing voltage is related to a second differential signal of the differential signal, wherein a first phase of the first differential signal and a second phase of the second differential signal are opposite; and
  receiving the sensing voltage pair and outputting a sampling data stream according to a clock of the differential signal and a voltage relative relationship of the sensing voltage pair.

13. The data sampling method of claim 12, wherein the step of receiving the differential signal and generating the sensing voltage pair according to the differential signal comprises:

receiving the differential signal and executing a sensing amplification for the differential signal in order to output a corrected pulse signal; and receiving the corrected pulse signal and executing a charging/discharging operation according to the corrected pulse signal in order to generate the sensing voltage pair.

14. The data sampling method of claim 13, wherein the step of receiving the corrected pulse signal and executing the charging/discharging operation according to the corrected pulse signal comprises:

receiving a first corrected pulse signal of the corrected pulse signal and executing a first charging/discharging operation according to the first corrected pulse signal in order to generate the first sensing voltage; and receiving a second corrected pulse signal of the corrected pulse signal and executing a second charging/discharging operation according to the second corrected pulse signal in order to generate the second sensing voltage.

15. The data sampling method of claim 14, wherein the first sensing voltage refers to a first potential difference of a first capacitor unit, and the step of executing the first charging/discharging operation according to the first corrected pulse signal comprises:

turning on or off a first charging path between the first capacitor unit and a first charging current source in response to the first corrected pulse signal.

16. The data sampling method of claim 15, wherein the step of executing the first charging/discharging operation according to the first corrected pulse signal further comprises:

turning off or on a first discharging path between the first capacitor unit and a first discharging current source in response to the first corrected pulse signal.

17. The data sampling method of claim 14, wherein the second sensing voltage refers to a second potential difference of a second capacitor unit, and the step of executing the second charging/discharging operation according to the second corrected pulse signal comprises:

turning on or off a second charging path between the second capacitor unit and a second charging current source in response to the second corrected pulse signal.

18. The data sampling method of claim 17, wherein the step of executing the second charging/discharging operation according to the second corrected pulse signal further comprises:

turning off or on a second discharging path between the second capacitor unit and a second discharging current source in response to the second corrected pulse signal.

19. The data sampling method of claim 12, wherein the step of outputting the sampling data stream according to the clock of the differential signal and the voltage relative relationship of the sensing voltage pair comprises:

receiving the sensing voltage pair and comparing the first voltage value and the second voltage value according to the clock of the differential signal in order to obtain the voltage relative relationship;

if the voltage relative relationship is the first voltage value being greater than the second voltage value, outputting first sampling data; and if the voltage relative relationship is the first voltage value being less than the second voltage value, outputting second sampling data.

20. The data sampling method of claim 13, wherein the step of generating the sensing voltage pair according to the differential signal further comprises:

resetting the sensing voltage pair according to the clock of the differential signal.

21. The data sampling method of claim 12, wherein the differential signal is a pulse width modulation signal generated by using a pulse width modulation technique.

22. The data sampling method of claim 12, wherein the data sampling method is used by a memory storage device, wherein when the memory storage device or a memory controlling circuit unit of the memory storage device is in an abnormal operating mode, the data sampling method is executed, wherein when the memory storage device or the memory controlling circuit unit is in a normal operating mode, the data sampling method is not executed.

23. A memory storage device, comprising:

a connection interface unit configured to couple to a host system;

a rewritable non-volatile memory module comprising a plurality of physical erasing units; and a memory controlling circuit unit, coupled to the connection interface unit and the rewritable non-volatile memory module, wherein the connection interface unit comprises a data sampling circuit module, and the data sampling circuit module comprises:

a sensing circuit, configured to receive a differential signal and generate a sensing voltage pair according to the differential signal, wherein the sensing voltage pair comprises a first sensing voltage and a second sensing voltage, a first voltage value of the first sensing voltage is related to a first differential signal of the differential signal, and a second voltage value of the second sensing voltage is related to a second differential signal of the differential signal, wherein a first phase of the first differential signal and a second phase of the second differential signal are opposite; and a sampling circuit, coupled to the sensing circuit, wherein the sampling circuit is configured to receive the sensing voltage pair and output a sampling data stream according to a clock of the differential signal and a voltage relative relationship of the sensing voltage pair.

24. The memory storage device of claim 23, wherein the sensing circuit comprises:

a sensing amplification circuit, configured to receive the differential signal and execute a sensing amplification for the differential signal in order to output a corrected pulse signal; and a voltage-to-current conversion circuit, coupled to the sensing amplification circuit, wherein the voltage-to-current conversion circuit is configured to receive the corrected pulse signal and execute a charging/discharging operation according to the corrected pulse signal in order to generate the sensing voltage pair.

25. The memory storage device of claim 24, wherein the voltage-to-current conversion circuit comprises:

a first charging/discharging circuit, configured to receive a first corrected pulse signal of the corrected pulse signal and execute a first charging/discharging operation according to the first corrected pulse signal in order to generate the first sensing voltage; and a second charging/discharging circuit, configured to receive a second corrected pulse signal of the corrected pulse signal and execute a second charging/discharging operation according to the second corrected pulse signal in order to generate the second sensing voltage.

26. The memory storage device of claim 25, wherein the first charging/discharging circuit comprises:

a first capacitor unit, wherein the first sensing voltage refers to a first potential difference of the first capacitor unit;

a first charging current source; and a first charging switch, serially connected to a first charging path between the first capacitor unit and the first charging current source and configured to turn on or off the first charging path in response to the first corrected pulse signal.

27. The memory storage device of claim 26, wherein the first charging/discharging circuit further comprises:

a first discharging current source; and a first discharging switch, serially connected to a first discharging path between the first capacitor unit and the first discharging current source and configured to turn off or on the first discharging path in response to the first corrected pulse signal.

28. The memory storage device of claim 25, wherein the second charging/discharging circuit comprises:

a second capacitor unit, wherein the second sensing voltage refers to a second potential difference of the second capacitor unit;

a second charging current source; and a second charging switch, serially connected to a second charging path between the second capacitor unit and the second charging current source and configured to turn on or off the second charging path in response to the second corrected pulse signal.

29. The memory storage device of claim 28, wherein the second charging/discharging circuit further comprises:

a second discharging current source; and a second discharging switch, serially connected to a second discharging path between the second capacitor unit and the second discharging current source and configured to turn off or on the second discharging path in response to the second corrected pulse signal.

30. The memory storage device of claim 23, wherein the sampling circuit comprises:

a comparison circuit, configured to receive the sensing voltage pair and compare the first voltage value and the second voltage value according to the clock of the differential signal in order to obtain the voltage relative relationship, wherein if the voltage relative relationship is the first voltage value being greater than the second voltage value, the comparison circuit outputs first sampling data, wherein if the voltage relative relationship is the first voltage value being less than the second voltage value, the comparison circuit outputs second sampling data.

31. The memory storage device of claim 24, wherein the sensing circuit further comprises:

a resetting circuit, coupled to the sensing amplification circuit and the voltage-to-current conversion circuit and configured to reset the sensing voltage pair according to the clock of the differential signal.

32. The memory storage device of claim 24, wherein the differential signal is a pulse width modulation signal generated by using a pulse width modulation technique.

33. The memory storage device of claim 24, wherein when the memory storage device or the memory controlling circuit unit is in an abnormal operating mode, the data sampling circuit module is activated, wherein when the memory storage device or the memory controlling circuit unit is in a normal operating mode, the data sampling circuit module is not activated.

* * * * *